United States Patent
Ok

(10) Patent No.: US 9,384,794 B2
(45) Date of Patent: Jul. 5, 2016

(54) SEMICONDUCTOR DEVICE AND METHOD OF OPERATING THE SAME

(71) Applicant: SK hynix Inc., Gyeonggi-do (KR)

(72) Inventor: Sung-Hwa Ok, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 83 days.

(21) Appl. No.: 14/106,008

(22) Filed: Dec. 13, 2013

(65) Prior Publication Data

US 2015/0019832 A1    Jan. 15, 2015

(30) Foreign Application Priority Data

Jul. 11, 2013    (KR) ..................... 10-2013-0081546

(51) Int. Cl.
G06F 13/00 (2006.01)
G11C 7/10 (2006.01)
G06F 13/16 (2006.01)

(52) U.S. Cl.
CPC .......... *G11C 7/1039* (2013.01); *G06F 13/1615* (2013.01)

(58) Field of Classification Search
None
See application file for complete search history.

(56) References Cited

U.S. PATENT DOCUMENTS

| | | | | |
|---|---|---|---|---|
| 5,542,059 A | * | 7/1996 | Blomgren | 712/41 |
| 2003/0208702 A1 | * | 11/2003 | Smetana | 713/400 |
| 2004/0117543 A1 | * | 6/2004 | Thomann et al. | 711/105 |
| 2004/0153678 A1 | * | 8/2004 | Ahmad et al. | 713/322 |
| 2005/0066148 A1 | * | 3/2005 | Luick | G06F 9/30101 712/1 |
| 2014/0195764 A1 | * | 7/2014 | Shen et al. | 711/167 |

FOREIGN PATENT DOCUMENTS

KR    1020080088185    10/2008

* cited by examiner

*Primary Examiner* — Jared Rutz
*Assistant Examiner* — Stephanie Wu
(74) *Attorney, Agent, or Firm* — IP & T Group LLP

(57) ABSTRACT

A semiconductor device includes a pipeline latch unit including a plurality of write pipelines, and suitable for latching data, and a control unit suitable for controlling at least one write pipeline of the write pipelines based on an idle signal.

12 Claims, 4 Drawing Sheets

SEMICONDUCTOR DEVICE AND METHOD OF OPERATING THE SAME

CROSS-REFERENCE TO RELATED APPLICATION

The present application claims priority of Korean Patent Application No. 10-2013-0081546, filed on Jul. 11, 2013, which is incorporated herein by reference in its entirety.

BACKGROUND

1. Field

Exemplary embodiments of the present invention relate to a semiconductor device and a method of controlling the same, and more particularly, to a control of a write pipeline latch.

2. Description of the Related Art

In general, when a data strobe signal (DQS) is inputted from a system to a semiconductor device at an abnormal timing, the semiconductor device may be stuck due to a malfunction in a write operation. In this case, there is a concern in that the semiconductor device needs to be initialized for a normal operation.

FIG. 1 is a timing diagram in a write operation of a conventional semiconductor device.

Referring to FIG. 1, a semiconductor device including a data strobe signal (DQS) counter generates an internal write signal WR(WL-05) in response to a data strobe signal DQS that is received after column address strobe write latency (CL) from a point in time at which a write command WT is received.

If a system inputs the data strobe signal DQS to the semiconductor device at an abnormal timing, a malfunction may be generated in the write operation of the semiconductor device.

FIG. 2 is a timing diagram in a write operation of a conventional semiconductor device when a data strobe signal is received at an abnormal time point.

Referring to FIG. 2, if a system inputs a data strobe signal DQS at an abnormal timing, for example, before the CWL passes, a semiconductor device may not count the data strobe signal DQS appropriately because a data strobe input signal DQS_IN may not latch an internal write signal WR(WL-05).

For example, if a CWL value is set to '10', it means that the number of clock cycles tCK) necessary for an external write command WT, the data strobe signal DQS, and data DQ to be received is '10'.

In order to inform the semiconductor device of the CWL value through a mode register set (MRS).

That is, the CWL value is set to '10' and the semiconductor device is informed of the CWL value of '10'. However, when a memory controller sends a clock CLK, the clock CLK may be received to the semiconductor device in the ninth clock or the eleventh clock.

Such a case may be referred to as the CWL violation of a data strobe signal DQS.

Furthermore, a CWL value may be inevitably violated, in particular, in a training process of a semiconductor device.

That is, there is a possibility that a data strobe signal DQS is received to semiconductor device while failing to meet an agreed CWL value during a data training process, which is performed for finding an optimized timing of the data strobe signal DQS corresponding to the semiconductor device.

In such a case, there may be a concern in that the activation order of the write pipelines in the semiconductor device may malfunction.

SUMMARY

Various embodiments of the present invention are directed to a semiconductor device that may prevent a malfunction in write pipelines due to a data strobe signal received at an abnormal timing.

In accordance with an embodiment of the present invention, a semiconductor device may include a pipeline latch unit including a plurality of write pipelines and suitable for latching data, and a control unit suitable for controlling at least any one write pipeline of the write pipelines based on an idle signal.

In accordance with another embodiment of the present invention, a method for operating a semiconductor device may include generating a pipeline control signal based on an idle signal, generating pipeline selection signals for selecting write pipelines based on the pipeline control signal, generating pipeline input control signals for controlling the write pipelines based on the pipeline selection signals so that the at least any one pipeline is activated, and latching, by the write pipelines, data in response to the pipeline input control signal.

In accordance with another embodiment of the present invention, a method for operating a semiconductor device may include maintaining only one of write pipelines in an active state based on a first data strobe signal, deactivating the activated pipeline based on an idle signal, and activating the deactivated pipeline based on a second data strobe signal.

In accordance with another embodiment of the present invention, a semiconductor device may include a pipeline latch unit including a plurality of write pipelines and suitable for latching data, a pipeline control signal generation unit suitable for generating a pipeline control signal based on a reset signal and an idle signal, a pipeline selection signal generation unit suitable for generating a plurality of pipeline selection signals for selecting the write pipelines based on the pipeline control signal, and a pipeline input control signal output unit suitable for generating a plurality of pipeline input control signal for controlling the write pipelines based on a data strobe signal and the pipeline selection signals.

DETAILED DESCRIPTION

Figure 1:
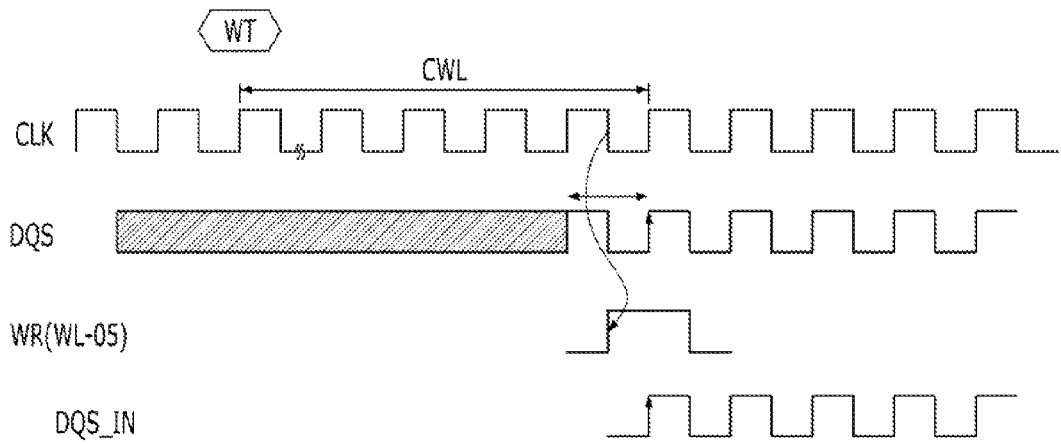
FIG. 1 is a timing diagram in a write operation of a conventional semiconductor device.
Figure 2:
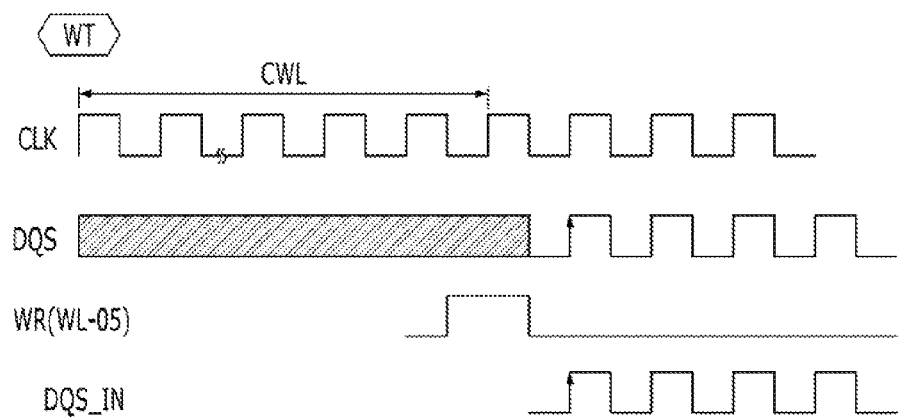
FIG. 2 is a timing diagram in a write operation of a conventional semiconductor device when a data strobe signal is received at an abnormal timing.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 3:
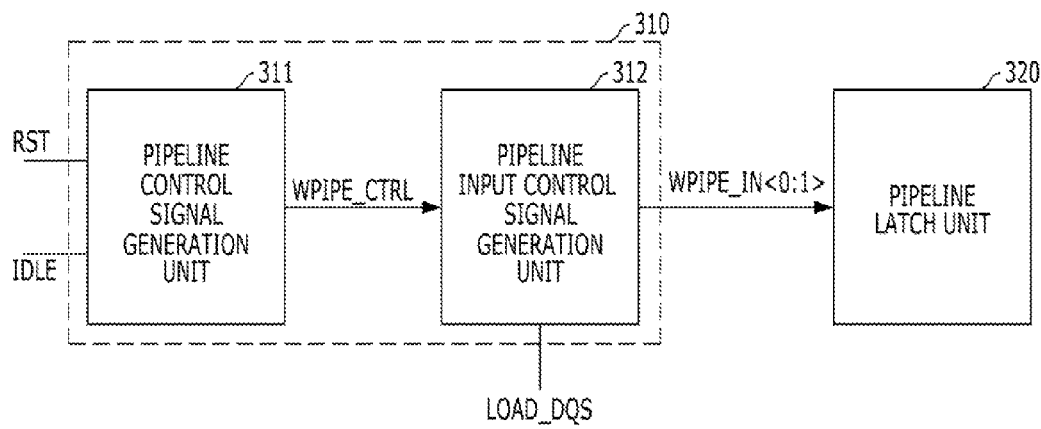
FIG. 3 is a block diagram illustrating a semiconductor device in accordance with an embodiment of the present invention.

FIG. 3 is a block diagram illustrating a semiconductor device in accordance with an embodiment of the present invention.

Referring to FIG. 3, the semiconductor device may include a control unit 310 and a pipeline latch unit 320.

The control unit 310 may include a pipeline control signal generation unit 311 and a pipeline input control signal generation unit 312.

The pipeline control signal generation unit 311 generates a pipeline control signal WPIPE_CTRL for controlling write pipelines included in the pipeline latch 320 based on a reset signal RST and an idle signal IDLE.

The pipeline control signal WPIPE_CTRL may control a first write pipeline to be activated before the semiconductor device internally performs a write operation and the semiconductor device inputs and outputs data to and from the first write pipeline.

In this case, although a system inputs a data strobe signal DQS to the semiconductor device at an abnormal timing, the data input/output timing of a write pipeline may be controlled.

Accordingly, although the data strobe signal DQS is received from the system at an abnormal timing, a continuous operation may be guaranteed without initializing the semiconductor device.

In a data training process performed after the semiconductor device is powered up, the data strobe signal DQS may be inputted to the semiconductor device at an abnormal timing.

The pipeline input control signal generation unit 312 generates pipeline selection signals (not illustrated in FIG. 3) for selecting the write pipelines to be inputted based on the pipeline control signal WPIPE_CTRL and generates pipeline input control signals WPIPE_IN<0:i> for controlling the write pipelines corresponding to the pipeline selection signals, among the write pipelines, so that the write pipeline latches data.

The pipeline selection signals and the pipeline input control signals WPIPE_IN<0:i> correspond to the write pipelines, respectively.

The pipeline latch unit 320 includes the write pipelines, and a write pipeline corresponding to an activated pipeline input control signal latches data.

Figure 4:
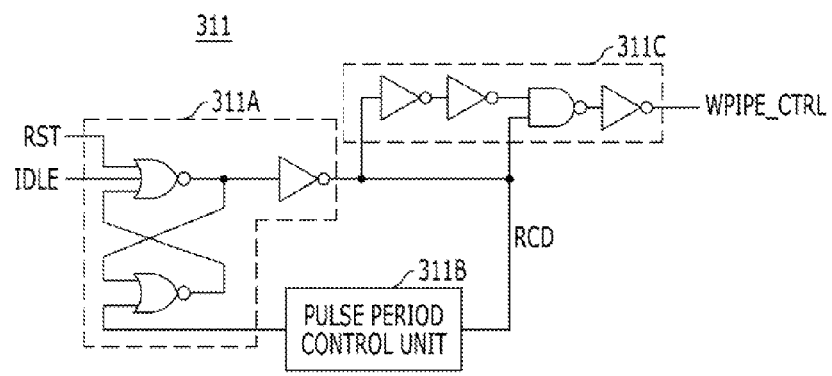
FIG. 4 is a detailed diagram of a pipeline control signal generation unit shown in FIG. 3.

FIG. 4 is a detailed diagram of the pipeline control signal generation unit 311 shown in FIG. 3.

The pipeline control signal generation unit 311 generates the pipeline control signal WPIPE_CTRL based on the idle signal IDLE. The idle signal IDLE may indicate an idle period of the semiconductor device. The idle period denotes a period from entry of a precharge operation accompanied with a write operation to start time point of a next write operation.

The reason why the idle signal IDLE is used in the embodiment of the present invention is that the semiconductor device may generate the pipeline control signal WPIPE_CTRL during an idle period in which a write operation is not performed.

The pipeline control signal generation unit 311 may include a flip-flop (or a latch) 311A, a pulse period control unit 311B, and a signal generation unit 311C.

The flip-flop 311A may be formed of a cross-coupled NOR latch and be driven based on the reset signal RST, the idle signal IDLE, and an output signal of the pulse period control unit 311B to latch the idle signal IDLE.

The pulse period control unit 311B function to control a pulse width of the idle signal IDLE that is generated in a pulse form. For example, the pulse period control unit 311B delays a rising edge of a latched signal RCD.

That is, the pulse period control unit 311B guarantees time point at which the idle signal IDLE is reset although a pulse width of the idle signal IDLE is relatively small or great so that the pipeline control signal WPIPE_CTRL may be stably generated.

The signal generation unit 311C generates the pipeline control signal WPIPE_CTRL based on the latched signal RCD output from the flip-flop 311A, which has a controlled pulse width.

Figure 5:
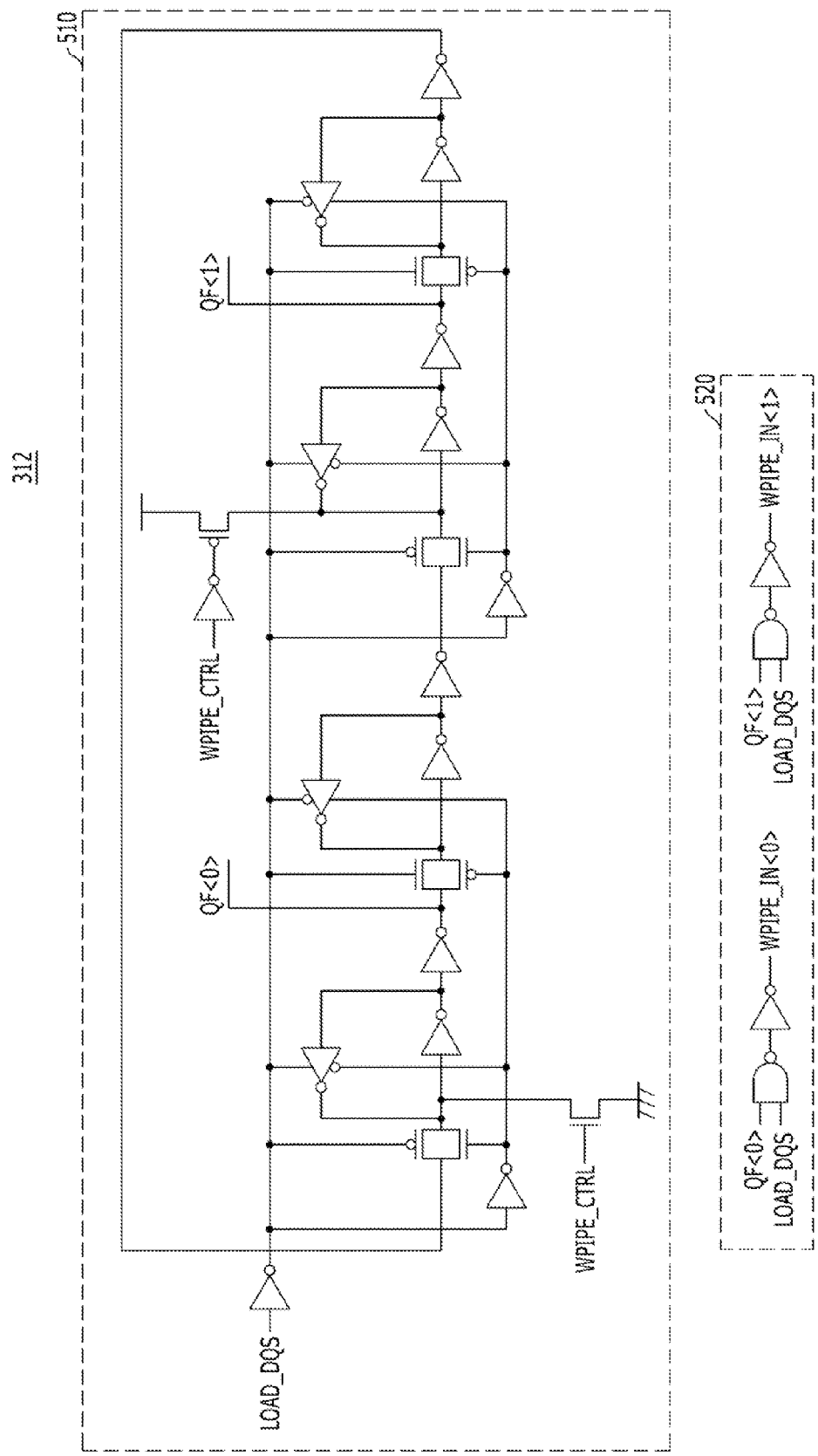
FIG. 5 is a detailed diagram of a pipeline input control signal generation unit shown in FIG. 3.

FIG. 5 is a detailed diagram of the pipeline input control signal generation unit 312 shown in FIG. 3.

Referring to FIG. 5, the pipeline input control signal generation unit 312 is may include a pipeline selection signal generation unit 510 and a pipeline input control signal output unit 520. The pipeline selection signal generation unit 510 generates pipeline selection signals QF<0> and QF<1> for selecting the respective write pipelines to be latched based on a data strobe signal LOAD_DQS and the pipeline control signal WPIPE_CTRL generated from the pipeline control signal generation unit 311. The pipeline selection signal generation unit 510 may be formed of a counter circuit with multiple stages (i.e., a data strobe signal (DQS) counter). Here, the pipeline selection signals QF<0> and QF<1> correspond to counting signals.

The pipeline input control signal output unit 520 generates pipeline input control signals WPIPE_IN<0> and WPIPE_IN<1> based on the data strobe signal LOAD_DQS and the pipeline selection signals QF<0> and QF<1> generated from the pipeline selection signal generation unit 510.

The pipeline input control signals WPIPE_IN<0> and WIPE_IN<1> are signals for controlling at least one write pipeline to latch data.

The pipeline selection signal generation unit 510 operates when the pipeline control signal WPIPE_CTRL has a logic high level. For example, when the pipeline control signal WPIPE_CTRL is a logic high level, the first pipeline selection signal QF<0> of a logic low level and the second pipeline selection signal QF<1> of a logic high level are output.

That is, the pipeline control signal WPIPE_CTRL controls at least one write pipeline (i.e., the first pipeline or the second pipeline) to latch data.

The data strobe signal LOAD_DQS maintains a logic high level during a specific period whenever a write command WT is received.

Thus, the pipeline selection signals QF<0> and QF<1> have complementary values.

In general, in order to control a write pipeline, a pipeline input signal for inputting data to the write pipeline and a pipeline output signal for outputting data from the write pipeline are needed.

If a first write pipeline and a second write pipeline exist, a first pipeline output signal needs to be activated so that the first write pipeline to which data is inputted based on a first write pipeline input signal may output data.

If the data strobe signal LOAD_DQS is received at an abnormal timing, for example, before the CWL passes, data may be received based on the first pipeline input signal, and data may be output based on the second pipeline output signal.

In order to prevent such concern, when the data strobe signal LOAD_DQS is received at an abnormal timing, the first write pipeline is activated and the second write pipeline is deactivated due to the pipeline control signal WPIPE_CTRL, so a normal operation may be performed without initializing the semiconductor device.

In conclusion, although the input/output sequence of pipeline latches is confused due to the data strobe signal LOAD_DQS received at an abnormal timing in a previous write operation, a normal write operation in which a subsequent data strobe signal LOAD_DQS is normally received may be performed without initializing the semiconductor device by controlling the input/output sequence of the pipeline latches due to the idle signal IDLE.

In the embodiment of the present invention, only the two write pipelines are illustrated and only the two pipeline selection signals QF<0> and QF<1> are illustrated as being generated, for convenience of description, but the present invention is not limited thereto. For example, if a plurality of write pipelines exist, only a desired pipeline selection signal may be activated, and the remaining pipeline selection signals may be deactivated (i.e., fixed with a deactivation value).

Figure 6:
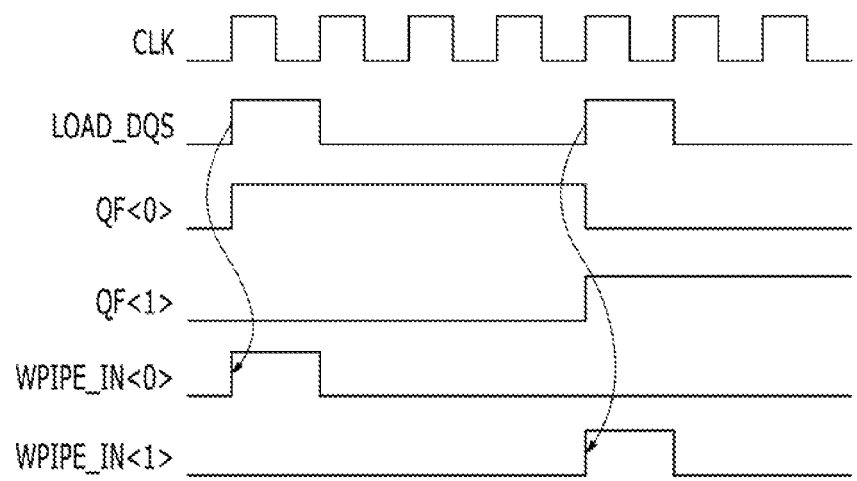
FIG. 6 is a timing diagram showing an abnormal operation of a pipeline input control signal generation unit without considering an idle signal IDLE.

The first pipeline selection signal QF<0> and the second pipeline selection signal QF<1> are complementarily activated. When the first pipeline selection signal QF<0> is activated, the second pipeline selection signal QF<1> is deactivated. If the number of write pipelines is two or more, only the first pipeline is activated, and the remaining write pipelines are deactivated. FIG. 6 is a timing diagram showing an abnormal operation of the pipeline input control signal generation unit 312 without considering the idle signal IDLE.

Referring to FIG. 6, when the data strobe signal LOAD_DQS is activated, the first pipeline selection signal QF<0> is activated, and the second pipeline selection signal QF<1> maintains deactivated state. If the data strobe signal LOAD_DQS is abnormally received prior to a time point at which the first pipeline selection signal QF<0> is deactivated, that is, if the data strobe signal LOAD_DQS is received in the state in which the second pipeline selection signal QF<1> is activated, the second pipeline input control signal WPIPE_IN<1> may be activated.

A data input/output operation needs to be performed by starting from the first pipeline. In the above case, the data input/output operation is erroneously performed by starting from the second pipeline. As a result, the semiconductor device may erroneously operate, and there is a concern in that the semiconductor device needs to be initialized to resolve the erroneous operation.

Figure 7:
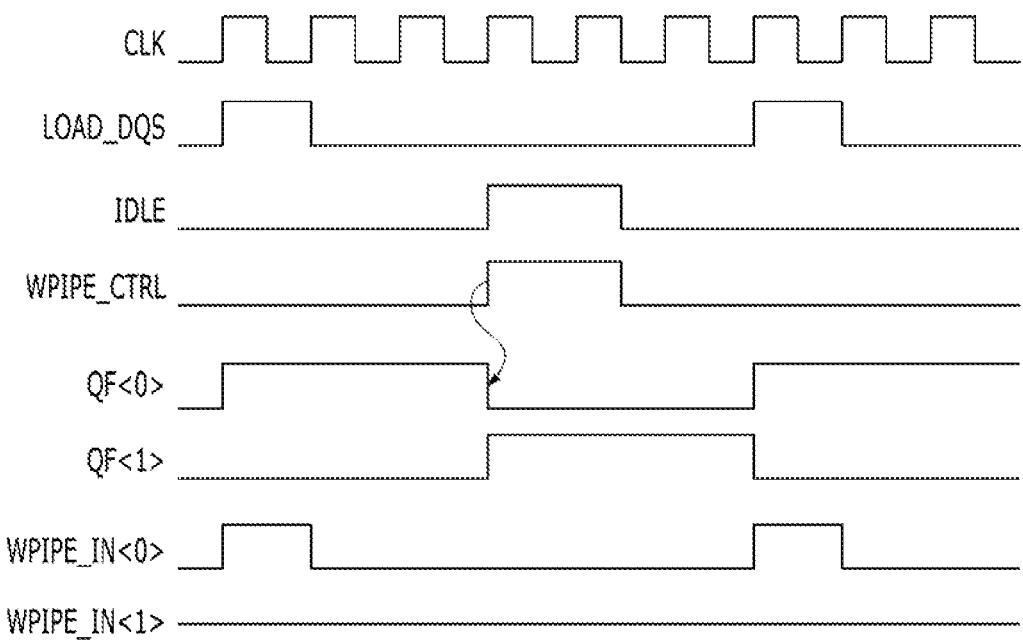
FIG. 7 is a timing diagram of a semiconductor device in accordance with the embodiment of the present invention.

FIG. 7 is a timing diagram of the semiconductor device in which a write pipeline is controlled based on the idle signal in accordance with the embodiment of the present invention.

Referring to FIG. 7, the first pipeline selection signal QF<0> is deactivated based on the pipeline control signal WPIPE_CTRL generated using the idle signal IDLE, and the first pipeline selection signal QF<0> is activated when a next data strobe signal LOAD_DQS is received. Meanwhile, when the data strobe signal LOAD_DQS is activated, the first pipeline selection signal QF<0> is activated and the second pipeline selection signal QF<1> maintains deactivated state.

When the pipeline control signal WPIPE_CTRL generated by using the idle signal IDLE is activated at a logic high level, the first pipeline selection signal QF<0> is deactivated at a logic low level, and the second pipeline selection signal QF<1> is activated at a logic high level. This denotes the reset of the pipeline selection signals.

Next, when the data strobe signal LOAD_DQS is received, the first pipeline selection signal QF<0> is activated to at a logic high level, and the second pipeline selection signal QF<1> is deactivated at a logic low level.

In response thereto, the first input control signal WPIPE_IN<0> for the first write pipeline is activated at a logic high level and the second input control signal WPIPE_IN<1> for the second pipeline is deactivated at a logic low level, so data may be inputted and outputted through the first write pipeline.

That is, the pipeline control signal WPIPE_CTRL resets the pipeline selection signals QF<0> and QF<1> during the idle period so that a data latching operation is always performed by starting from the first write pipeline.

Even when the data strobe signal LOAD_DQS received at an abnormal timing in a previous write operation, a normal write operation in which a subsequent data strobe signal LOAD DQS is normally received may be performed without initializing the semiconductor device by controlling the write pipelines based on the idle signal IDLE.

Accordingly, the confusion of the sequence in the write pipelines attributable to the data strobe signal LOAD DQS received at an abnormal timing may be prevented.

In addition to the idle signal IDLE, the pipeline control signal WPIPE_CTRL may be internally generated through a mode register set (MRS) operation. That is, an additional reset signal, such as an idle signal IDLE, used in the pipeline control signal generation unit 311 may be selectively generated by the designer.

The semiconductor device in accordance with the embodiments of the present invention may control the sequence of activated write pipelines based on the additional reset signal, for example, the idle signal, before performing a write operation.

Furthermore, there is an advantage in that a continuous operation may be guaranteed without initializing the semiconductor device.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
    a pipeline latch unit including a plurality of write pipelines, and suitable for latching data; and
    a control unit suitable for controlling at least one write pipeline of the write pipelines based on an idle signal,
    wherein the at least one write pipeline is first activated whenever the idle signal is activated,
    wherein the control unit comprises:
        a pipeline control signal generation unit suitable for generating a pipeline control signal to be set/reset based on the idle signal:
        a pipeline selection signal generation unit suitable for generating pipeline selection signals and for activating one of the pipeline selection signals based on the pipeline control signal; and
        a pipeline input control signal output unit suitable for generating pipeline input control signals based on the activated one pipeline selection signal and a data strobe signal so that the at least one write pipeline is activated.

2. The semiconductor device of claim 1, wherein the idle signal is a signal indicating an idle period of the semiconductor device, wherein the idle period denotes a period from an entry of a precharge operation accompanied with a write operation to a start time point of a next write operation.

3. The semiconductor device of claim 1, wherein the pipeline control signal generation unit comprises a pulse period control unit suitable for reducing a pulse width of a signal generated in a pulse form by delaying a rising edge of the signal.

4. The semiconductor device of claim 1, wherein the pipeline control signal generation unit comprises:
   a latch suitable for latching the idle signal;
   a pulse period control unit suitable for controlling a pulse width of the latched idle signal; and
   a signal generation unit suitable for generating the pipeline control signal based on the latched signal.

5. The semiconductor device of claim 1, wherein a plurality of the pipeline selection signals and a plurality of the pipeline input control signals correspond to the respective write pipelines.

6. A method for operating a semiconductor device, comprising:
   generating a pipeline control signal to be set/reset based on an idle signal;
   generating pipeline selection signals and activating one of the pipeline selection signals for selecting one write pipeline based on the pipeline control signal;
   generating pipeline input control signals for controlling the write pipelines based on the activated one pipeline selection signals and a data strobe signal so that the at least one pipeline is activated; and
   latching, by the write pipelines, data in response to the pipeline input control signals,
   wherein the at least one write pipeline is first activated whenever the idle signal is activated.

7. The method of claim 6, wherein the idle signal is a signal indicating an idle period of the semiconductor device, wherein the idle period denotes a period from an entry of a precharge operation accompanied with a write operation to a start time point of a next write operation.

8. The method of claim 6, wherein the generating of the pipeline control signal comprises reducing a pulse width of a signal generated in a pulse form by delaying a rising edge of the signal.

9. The method of claim 6, wherein the generating of the pipeline control signal comprises:
   latching the idle signal;
   controlling a pulse width of the latched idle signal; and
   generating the pipeline control signal based on the latched signal.

10. A semiconductor device, comprising:
   a pipeline latch unit including a plurality of write pipelines, and suitable for latching data;
   a pipeline control signal generation unit suitable for generating a pipeline control signal to be set/reset based on a mode register set information;
   a pipeline selection signal generation unit suitable for generating a plurality of pipeline selection signals for selecting the write pipelines based on the pipeline control signal and for activating a portion of the pipeline selection signals based on the pipeline control signal; and
   a pipeline input control signal output unit suitable for generating a plurality of pipeline input control signal for controlling the write pipelines based on a data strobe signal and the activated -pipeline selection signals.

11. The semiconductor device of claim 10, wherein the pipeline control signal is internally generated whenever the mode register set information is received.

12. The semiconductor device of claim 10, wherein a plurality of the pipeline selection signals and a plurality of the pipeline input control signals correspond to the respective write pipelines.

* * * * *